United States Patent
Morfill et al.

(10) Patent No.: US 7,869,556 B2
(45) Date of Patent: Jan. 11, 2011

(54) METHOD AND DEVICE FOR THE OPERATION OF A PLASMA DEVICE

(75) Inventors: Gregor Morfill, München (DE); Uwe Konopka, Neufahrn (DE); Hubertus M. Thomas, Pfaffenhofen/Ilm (DE); Wolfgang Jacob, Garching (DE); Beatrice Annaratone, München (DE); Martin Fink, Mintraching (DE); Noriyoshi Sato, Sendai (JP); Tetsuji Shimizu, Garching (DE); Timo Stuffler, Seefeld (DE)

(73) Assignee: Max-Planck-Gesellschaft zur Forderung der Wissenschaften e.V. (DE)

( * ) Notice: Subject to any disclaimer, the term of this patent is extended or adjusted under 35 U.S.C. 154(b) by 715 days.

(21) Appl. No.: 11/792,740

(22) PCT Filed: Dec. 9, 2005

(86) PCT No.: PCT/EP2005/013233

§ 371 (c)(1),
(2), (4) Date: Nov. 26, 2007

(87) PCT Pub. No.: WO2006/063738

PCT Pub. Date: Jun. 22, 2006

(65) Prior Publication Data

US 2008/0136332 A1  Jun. 12, 2008

(30) Foreign Application Priority Data

Dec. 15, 2004  (DE) ............... 10 2004 060 377

(51) Int. Cl.
*H05H 1/18* (2006.01)
(52) U.S. Cl. ............... 376/123; 376/121; 376/132; 376/127

(58) Field of Classification Search ............ 376/120, 376/121, 123, 132, 127, 128; 156/345.44, 156/345.47; 118/723 E, 723 R; 315/500
See application file for complete search history.

(56) References Cited

U.S. PATENT DOCUMENTS 4,922,099 A  5/1990  Masuda et al.
5,289,509 A * 2/1994  Moeller ............... 376/123

(Continued)

FOREIGN PATENT DOCUMENTS

DE  40 34 697 A1  5/1992

(Continued)

OTHER PUBLICATIONS

P. St'ahel et al., "Metastability studies in silicon thin films: from short range ordered to medium and long range ordered materials," Journal of Non-Crystalline Solids, © Elsevier Science B.V., 1998, pp. 226-280.

(Continued)

*Primary Examiner*—Haissa Philogene
(74) *Attorney, Agent, or Firm*—DLA Piper LLP (US)

(57) ABSTRACT

A method for the operation of a plasma device (100) is described in which particles (2) are arranged in a plasma, wherein a generation of electric travelling waves (1) is provided, under whose effective action the particles (2) in the plasma device (100) perform a directed movement to at least one pre-determined collection area (20, 20A). A plasma device for carrying out the method is also described.

37 Claims, 4 Drawing Sheets

U.S. PATENT DOCUMENTS

| | | | |
|---|---|---|---|
| 5,350,454 A | 9/1994 | Ohkawa | |
| 5,354,443 A * | 10/1994 | Moslehi | 204/192.12 |
| 5,401,356 A | 3/1995 | Enami et al. | |
| 6,149,789 A | 11/2000 | Benecke et al. | |
| 6,596,143 B1 | 7/2003 | Wang et al. | |
| 6,893,532 B1 * | 5/2005 | Sato et al. | 156/345.47 |
| 2002/0026984 A1 | 3/2002 | Marxer et al. | |

FOREIGN PATENT DOCUMENTS

| | | |
|---|---|---|
| DE | 44 12 902 A1 | 11/1994 |
| EP | 0 392 678 A2 | 10/1990 |
| EP | 0 425 419 A2 | 5/1991 |
| JP | 02-258048 A | 10/1990 |
| JP | 2004 259832 A | 9/2004 |
| WO | 99/52125 | 10/1999 |
| WO | 01/01467 A1 | 1/2001 |

OTHER PUBLICATIONS

A.V. Ivlev et al., "Decharging of Complex Plasmas: First Kinetic Observations," Physical Review Letters, © The American Physical Society, Feb. 2003, vol. 90, No. 5, pp. 055003-1-055003-4.

Y. Kurimoto et al., "Fine particle removal by a negatively-charged fine particle collector in silane plasma," Thin Solid Films, © Elsevier B.V., 2004, vol. 457, pp. 285-291.

A. Desai et al., "A MEMS electrostatic particle transportation system," Sensors and Actuators, © Elsevier Science S.A., 1999, vol. 73, pp. 37-44.

* cited by examiner

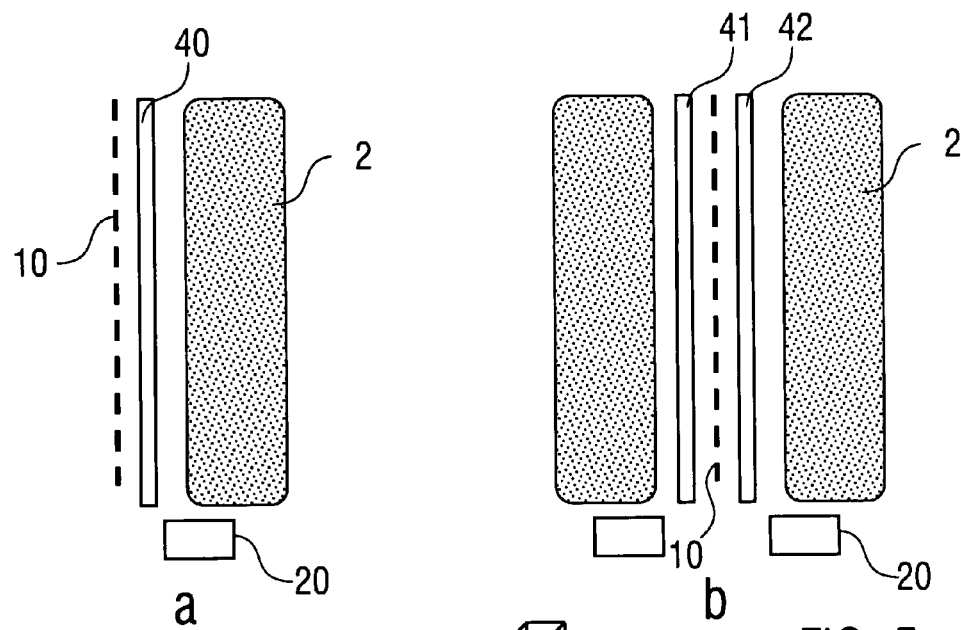
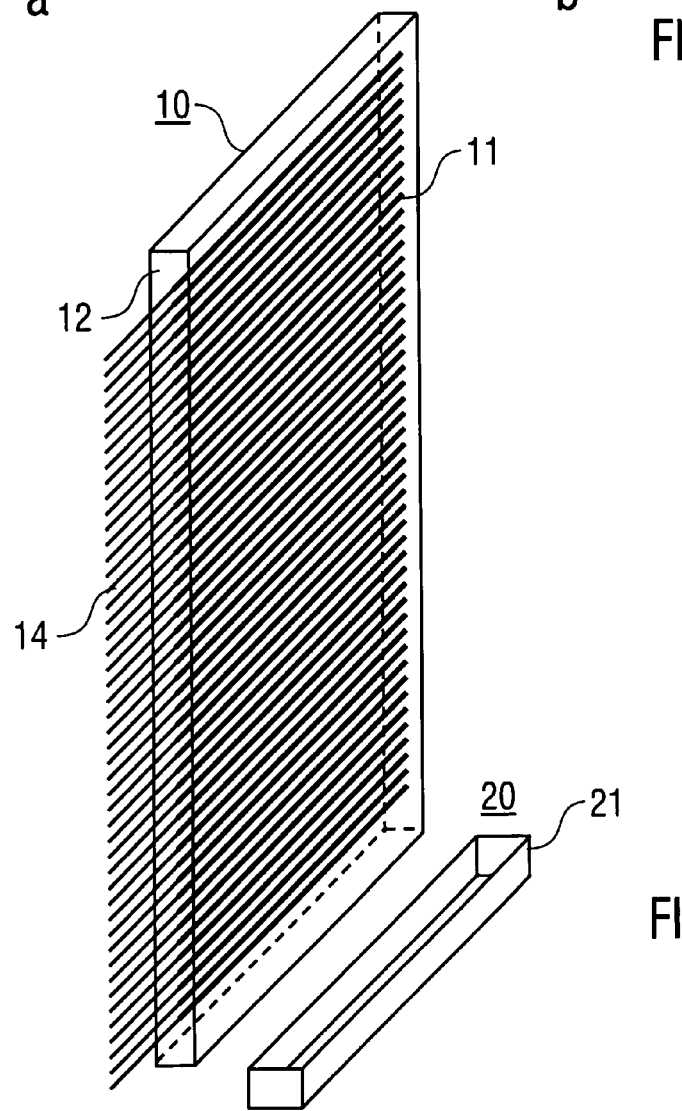

METHOD AND DEVICE FOR THE OPERATION OF A PLASMA DEVICE

FIELD OF THE INVENTION

The present invention relates to methods for the operation of a plasma device, as for example for the plasma-based material deposition or surface processing, and in particular to methods for the manipulation of particles in a plasma device. The present invention also relates to plasma devices which are configured for the implementation of such methods.

BACKGROUND OF THE INVENTION

It is generally known that there can be particles in a gas in which a plasma condition is generated by means of an electric discharge. The particles are, for example, specifically introduced into the plasma from the outside or are generated in the said plasma by means of a pre-determined process sequence (refer to, e.g. "Dusty Plasmas: Physics, Chemistry and Technological Impact in Plasma Processing" (ed. A. Bouchoule), J. Wiley & Sons, 1999). In this case, particularly an examination or manipulation of the particles in the plasma can be desirable. During the examination of the particles, for example, an interaction of particles (e.g. during the generation of so-called plasma crystals) or the development or the growth of the particles are to be characterised. The manipulation of particles can comprise, for example, a particle processing in the plasma (surface removal or surface separation) or the deposition of the particles on substrates, as is the case during the controlled deposition of polymorphic layers (Cabarrocas et al. J. of Non-Crystalline Solids 227-230 (1998) 871-875). In the deposition of polymorphic layers, the separation or the deposition of particles in a certain particle size distribution can be of interest. However, a practical method for the setting of a particle size distribution has not been available up to the present time.

Alternatively, the particles in the plasma or on a substrate can represent an undesirable contamination. As an example, during the manufacture of solar cells, wafers or components for the flat screen technology by plasma deposition, the quality and the failure rate of the products can be substantially determined by the capability to keep away the disturbing particles from the substrates to be coated. Particles can cause local discharges on the substrate and, subsequently, holes in the layer through which the image quality, for example, of a flat screen is diminished.

One cause of the substrate contamination is that, after a coating operation when the plasma is switched off in a plasma reactor, the particles formed in the plasma with typical dimensions in the nm range to the um range carry an electric net charge (typically a negative charge), whereas the substrate surface has an opposing charge. This leads to a previously unavoidable particle movement to the substrate surface, even if the plasma coating is performed on vertically aligned substrates (Ivlev et al. "Decharging of Complex Plasmas: First Kinetic Observations" in "Phys. Rev. Lett.", Volume 90, Page 5). The problems mentioned here occur particularly with the plasma deposition on large substrates with typical diameters in the dm range to the m range.

With the applications for the examination or manipulation of particles in the plasma as well as with the particle contamination, there is generally an interest in exerting influence on the location, distribution and/or movement of the particles in a pre-determined manner. It is proposed in WO 99/52125, in a plasma reactor with additional electrodes or with the use of a so-called adaptive electrode with a plurality of partial electrodes, to set or to change the electric field statically or with low frequency in such a way that the particles assume a certain spatial distribution over the substrate in the plasma reactor. However, this technique can be disadvantageous in that the defined objectives of examining or manipulating particles in the plasma can only be solved to a limited extent and that the deposition on the substrate reproduces the structure of the electrodes.

SUMMARY OF THE INVENTION

The objective of the invention is to present an improved method for the operation of a plasma device with which the disadvantages of the conventional technologies for examining or manipulating particles in the plasma are overcome and that in particular a reliable and specific movement of particles in the plasma is made possible. The method according to the invention should have in particular an extended application range and open the way to new options for influencing the particles in the plasma. It is also the objective of the invention to present an improved plasma device with which the disadvantages of the conventional plasma reactors are overcome and which is suitable for influencing particles in the plasma.

With reference to the method, the invention is based on the general technical teaching of generating electric travelling waves in a plasma device through which waves forces are exerted on particles in the plasma, so that the particles are moved in a directed manner to at least one pre-determined collection area in the plasma device. The electric travelling waves advantageously cause a particle transport with a net flow of particles towards the collection area. As opposed to conventional techniques where merely a positioning or redistribution of particles without a net flow was envisaged, the travelling waves enable a continual particle movement during and/or after the formation of the plasma. With this, particles which are continually and subsequently formed in the plasma during a plasma deposition, for example, can be removed advantageously and constantly from a plasma area, particularly from the vicinity of a substrate that is to be coated. In the result, contaminations can be avoided and layers with a considerably improved homogeneity can be generated. The above-mentioned quality losses and equipment failures of the resulting products can be reduced and/or the plasma conditions for a manufacturing process can be optimised.

The electric travelling waves can advantageously run through the entire plasma area without restriction, so that the particle transport reliably takes place over extended substrates also, as coated for example in the semiconductor or solar cell technology.

The plasma device generally comprises a device with an evacuation-capable inner zone, in particular with a plasma chamber, which is filled with an operating gas for generating plasma and where electric fields can be applied for the ignition of a plasma discharge. An electric travelling wave is generated by an electric field distribution (travelling field) moving in the time sequence, preferably periodically repeated in a certain direction. According to the invention, a travelling wave can be generated with a pre-determined direction or several travelling waves with pre-determined directions, for example two travelling waves running oppositely relative to one another. By means of the interaction with the field of the travelling wave the particles perform a directed movement, meaning, they are shifted in a direction parallel to the running direction of the travelling wave. The term "directed movement" can include movements at least of parts of a particle quantity in several directions in each case when several travelling waves with various running directions are generated.

According to a preferred embodiment of the invention the electric travelling waves are generated with a plurality of strip electrodes which are arranged next to one another in the plasma device and are loaded with one or several alternating voltages (collection alternating voltage). The use of strip electrodes has the advantage of a high degree of flexibility with the generation of the travelling waves. The parameters of the electric travelling waves, particularly the wave form as well as the frequency and amplitudes, can be adapted with a minor work effort to the characteristics of the particles which are to be transported or deposited (separated), such as for example to their size or dielectric characteristics. Furthermore, the strip electrodes can be arranged without any problems in an existing plasma device without having any detrimental effect on its function, such as for example the coating of a substrate. In an advantageous manner, travelling waves can be generated with the strip electrodes which waves are uniform along the longitudinal course of the strip electrodes and the running direction of which is determined by the arrangement direction of the strip electrodes.

Further advantages for the generation of travelling waves can result if all strip electrodes are loaded with a common collection alternating voltage, this however with a pre-determined delay or phase shift in each case. The loading of the strip electrodes with specific phase shifts in each case means that strip electrodes, which are arranged in sequence and adjacent to one another in accordance with the desired movement direction of the particles to the collection area, are charged with the collection alternating voltage with a time lag so that the continuing travelling wave is generated in the desired direction of movement of the particles.

The method according to the invention has advantageously a high degree of variability with the selection of the collection alternating voltage or its adaptation to the conditions of the individual practical application. According to a first variant, the collection alternating voltage can be established with a symmetrical voltage characteristic. The time-dependency of the collection alternating voltage is characterised in this case by two edges mirror-symmetrical to one another within one period. This embodiment of the invention enables in an advantageous manner that available alternating voltage sources can be used for the provision of the collection alternating voltage. The migration velocity of the amplitude maxima of the collection alternating voltage is selected preferably in dependence of the size and the material of the particles in such a way that the transported particles are entrained with the front edges of the travelling waves. Voltage sources are particularly preferred in this case which provide for sinus-shaped or pulse-shaped voltage characteristics.

According to an alternative variant, the collection alternating voltage has an asymmetrical voltage characteristic. This means that, within one period, the rising and falling edges have various slopes. With this embodiment of the invention, the travelling wave has advantageously the form of a ramp profile that moves over the strip electrodes and, under whose effect, the particles are transported to the collection area. Preferably the front edge has the lesser slope, so that there is relatively a lot of time for an effective force exertion on the particles, whereas the rear-side edge has a steeper drop. During the passage through the rear-side edge there is hardly any backward movement due to the particle inertia with larger particles. As a result, only larger particles are selectively transported in the plasma.

Advantageously, the collection alternating voltage within a period can have a trapezoidal form. This means that there is in each case a direct voltage section between the rising and falling edges. This embodiment of the invention has the advantage that the steepness of the edges is freely selectable without having to change the period (or frequency) of the collection alternating voltage.

The asymmetrical form of the travelling wave has the particular advantage that, with the setting of the wave form and in particular with the setting of the slope and/or the duration of the edges, a size selection of the transported particles according to the invention can take place. The larger the particles, the slower the requirement for the edge of the collection alternating voltage to change so that an effective particle transport is obtained. This enables that the wave form, at least by means of one of the measures which comprise an increase of the frequency of the collection alternating voltage, an increase of the slope and a shortening of the edges of the collection alternating voltage, only such particles are subjected to the transport according to the invention whose size does not exceed a pre-determined maximum size.

Due to the already-mentioned correlation between the frequency and/or the form of the travelling waves and the size of the transportable particles according to the invention, the collection alternating voltage with one embodiment of the invention, where the plasma is generated in the plasma device by means of a high-frequent operating alternating voltage, is provided preferably with a frequency which is less than the frequency of the operating alternating voltage. Particularly preferred is a frequency of the collection alternating voltage in the range of 0.01 Hz to 10 Hz, particularly from 0.1 Hz to 10 Hz where, however, the particle transport according to the invention can be adjustably set at higher frequencies also (e.g., 100 Hz or higher).

If, according to a preferred embodiment of the invention, the strip electrodes are loaded with the collection alternating voltage as well as with an operating voltage of the plasma device for the purpose of forming the plasma, there can be further advantages for the practical operation of the plasma device. Firstly, and as a result of the superimposition of the collection alternating voltage and the operating voltage, the particles are subjected to the electric travelling waves at that particular location where they primarily originate. Secondly, the structure of the plasma device is simplified because no separate electrode is required for the generation of the plasma. With this embodiment of the invention, all strip electrodes are impacted with the operating voltage of the plasma device which is superimposed with the collection alternating voltage. Depending on the operating mode of the plasma device, the operating voltage can be a direct voltage or a high-frequency voltage.

Alternatively, at least one separate power electrode can be provided in the plasma device in addition to the strip electrodes, which power electrode is charged with the operating voltage of the plasma device for the purpose of plasma formation. This embodiment of the invention has the advantage that, by the strip electrodes, only two functions are taken over, particularly the travelling wave generation and a homogenisation of the electric field (see below), whereas the power electrode is provided for the operation of the plasma process.

With the superimposition of the collection alternating voltage and the operating voltage of the plasma device, the electric travelling waves can be advantageously and continually generated during the generation of the plasma. Alternatively, a separate provision of the collection alternating voltage (superimposed with a direct voltage) is possible, with which the particle transport takes place only during pre-determined collecting times before or after the generation of the plasma.

According to a further preferred embodiment of the invention, the collection alternating voltage is superimposed with a higher frequent modulation voltage. This superimposition advantageously enables a timing-averaged homogenisation of the plasma. Under the effect of the modulation voltage, ions in the plasma are moved while the substantially larger particles remain unaffected. The ions can be distributed more evenly in this way, a fact that is advantageous in particular with the plasma-based material separation on substrates. The parameters of the, e.g., sinus-shaped modulation voltage are selected in dependence of the geometrical properties of the electrode strips (particularly the strip width) and the wave form of the travelling wave as well as in dependence of the concentration and energy of the ions in the plasma. The amplitude of the modulation voltage is preferably selected in such a way that, in the course of a half period of the modulation voltage, ions can be transported over a length corresponding to half the step width between the electrode strips.

The frequency of the modulation voltage is selected in dependence of the practical operating conditions of the plasma device. If the strip electrodes according to the above-mentioned embodiment of the invention are impacted with the collection alternating voltage as well as with the operating voltage, the frequency of the modulation voltage is selected preferably in the kHz-range, particularly in the range from 0.1 kHz to 100 kHz. With the modified embodiment with separate strip and power electrodes, however, the frequency of the modulation voltage is selected in the kHz range to the MHz range, particularly in the range between 10 kHz to 1 MHz.

It can be advantageous for a reliable collection of the transported particles in the collection area if, according to a further modification of the invention, the at least one collection area has a hollow cathode in each case. The hollow cathode as such is known (refer to: Y. Kurimoto et al. in "Film Solid Film", Vl. 457, 2004, Page 285-291, and WO 01/01467). Their use has the advantage that the particles in the collection area are retained under the effect of electric fields. The particles can be collected and used again.

Alternatively or additionally, the collection area can be formed by an accumulation zone in which the particles are accumulated in the suspended condition in the plasma. The formation of an accumulation zone in the plasma chamber can be advantageous for the examination of particle clouds or for the deposition of large particle quantities on substrates.

According to a further variant of the invention the electric travelling waves can be generated with various directions, particularly with directions opposing one another, so that the particles perform aligned movements to at least two pre-determined collection areas. A material-specific or size-specific collection of the particles can advantageously and subsequently take place in various collection areas. The movements in the various directions can be realised simultaneously or time-separated, for example in successive order.

A further significant advantage of the invention lies in the variability during the configuration of the movement direction of the particles. The travelling waves can move linearly in a pre-specified direction which runs essentially vertical to the expansion of planar-arranged strip electrodes. Alternatively, a circular movement can be induced with strip electrodes which are arranged in a circular shape on the outer periphery of a plasma chamber.

The above-mentioned object is solved related to the device by the general technical teaching of equipping a plasma device, which is provided for the formation of a plasma, with at least one electrode for generating electric travelling waves for the directed transport of particles in the plasma device and at least one collection area for accommodating the particles. The combination, according to the invention, of at least one electrode for the generation of travelling waves (in the following: travelling wave electrode) and at least one collection area enables advantageously the specific removal of particles from the plasma and particularly from a layer-shaped zone above a substrate in the plasma device.

The travelling wave electrode preferably comprises a plurality of strip electrodes, each of which is connected to a voltage source for generating the collection alternating voltage. The strip electrodes are arranged preferably in one plane, so that the travelling wave electrode can be advantageously arranged immediately adjacent to a substrate on its opposing side relative to the plasma.

The strip electrodes of the travelling wave electrode preferably form a line lattice. They all have the same size and form, for example a straight form or a curved line form, and a constant step width (constant mutual distances from centre-to-centre of adjacent strip electrodes). The use of straight electrode strips has advantages for the homogeneity of the travelling waves for the particle transport.

Generally, each of the strip electrodes can be integrally formed. Alternatively, the formation of an electrode strip is possible by means of a series of electrode segments joined electrically to one another, for example square-type electrode segments as known from conventional adaptive electrodes.

According to a preferred embodiment of the plasma device according to the invention the travelling wave electrode has a plate-shaped electrode carrier, wherein the strip electrodes are arranged on at least one surface of the electrode carrier. The provision of the electrode carrier has the advantage that a compact structural component is created with a defined arrangement of the strip electrodes.

It can be advantageous particularly for applications related to plasma-based material deposition if strip electrodes are arranged on both surfaces of the electrode carrier. This enables a coating arrangement with two vertically arranged substrates, between which the travelling wave electrode is located for transporting away the particles over both electrode surfaces.

According to a preferred embodiment of the invention, the strip electrodes comprise wire electrodes which are insulated from one another and inserted into the electrode carrier or arranged on its surface. Wire electrodes have the advantage that they can be arranged with a particularly narrow spacing distance. This has a positive effect on the setting of an essentially smooth and stepless wave form of the travelling waves. Furthermore, wire electrodes have advantages with reference to the freedom of the configuration of the electrode arrangement. Alternatively, the electrode strips are formed in a layer-type manner on the surface of the electrode carrier. The layer-type configuration is advantageous because of the reduced capacitive coupling in this case between adjacent electrode strips.

For the purpose of realisation of the above-mentioned circular shaped movement of the particles, the travelling wave electrode has a ring-shaped electrode carrier on whose surface the strip electrodes are arranged. The ring-shaped strip electrode advantageously enables a further use of the particle transport, according to the invention, by means of travelling waves, a particle acceleration taking place in the plasma, e.g. by means of an increase of the migration velocity of travelling waves in one or several adjacently arranged rings of strip electrodes.

According to a further variant of the invention, the travelling wave electrode comprises strip electrode groups each with a plurality of strip electrodes. The strip electrodes belonging to a strip electrode group are electrically connected to one another. The strip electrodes are arranged in such a way that each one of the strip electrodes in successive order belongs to another strip electrode group. With the arrangement of the strip electrodes, a periodic pattern is provided wherein the periods respectively contain in the same order strip electrodes of each strip electrode group. The compilation of strip electrodes to groups advantageously enables that all strip electrodes belonging to a strip electrode group are impacted with the same phase position of the collection alternating voltage. By means of the above-mentioned periods, particularly the extension of a period of the electric travelling waves is defined.

If the travelling wave electrode is equipped with a heating device according to a further modification of the invention, this can have advantages for the manufacture of polymorphic layers, e.g., for Si-based solar cells and/or for the protection of the strip electrodes against deposition. The smaller particles can be transported away from the plasma according to the invention, whereas the larger particles are deposited on the substrate. These larger particles can be excited to a further crystallographic growth by heating the substrate with the heating device, or can be subjected to a curing process.

BRIEF DESCRIPTION OF THE DRAWINGS

Further details and advantages are described as follows with reference to the attached drawings. The drawings show the following:

FIGS. 5 and 6: details of further embodiments of plasma devices, according to the invention, with vertically aligned main electrodes.

DETAILED DESCRIPTION OF THE PREFERRED EMBODIMENT

Figure 1:
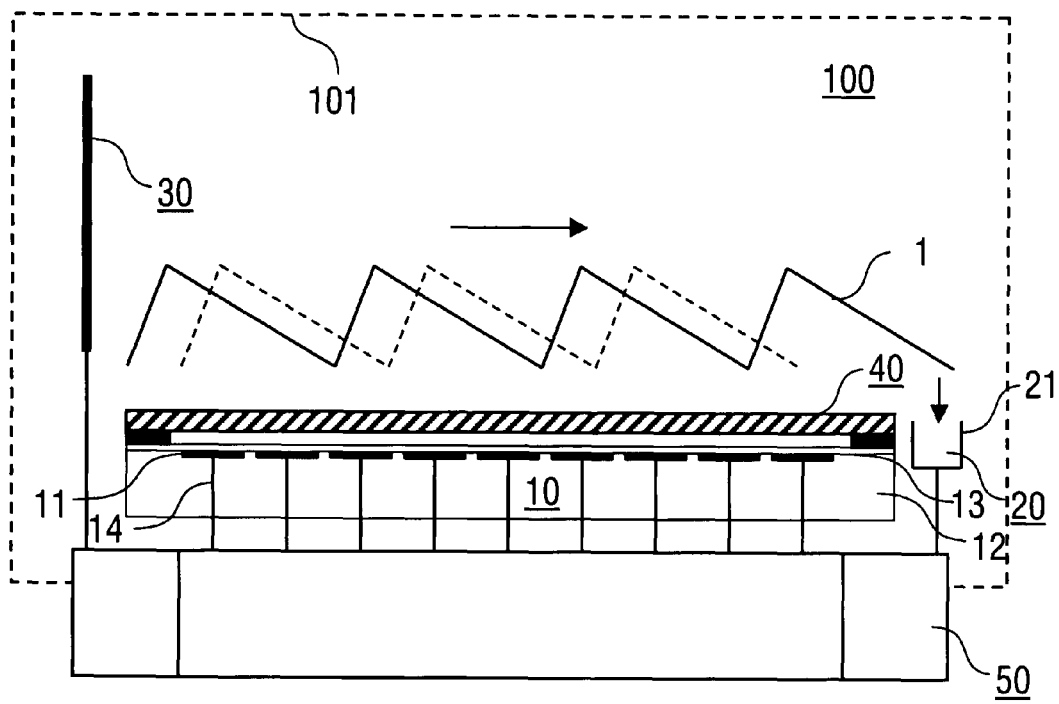
FIG. 1: a schematic illustration of a first embodiment of a plasma device according to the invention.

Details of the method according to the invention are explained as follows with reference to the plasma device 100 as shown in FIG. 1. Known details of the plasma device and its operation, particularly the operating conditions for the generation of plasma, are not described here.

FIG. 1 shows schematically the plasma device 100 with a travelling wave electrode 10, a collection area 20, a counter electrode 30, a substrate 40 and a control apparatus 50. The mentioned components 10 to 40 are arranged in a plasma chamber 101 which can be evacuated (illustrated with dashed lines). In the plasma chamber 101 a plasma condition can be ignited in an operating gas. Particles can form in the plasma, or particles can be fed from the outside into the plasma. The particles have sizes in the range, for example, between 10 nm to 20 μm.

The travelling wave electrode 10 comprises a plurality of electrode strips 11 which are arranged on a plate-shaped electrode carrier 12 and are each connected with the control apparatus 50 by way of an electrode connection 14. In FIG. 1, the strip electrodes 11 are entered in the drawing for illustration purposes and are not to scale. In order to obtain best possible stageless travelling waves and a best possible small capacitive coupling between adjacent strip electrodes, these are arranged with a small thickness and a narrow spacing clearance as best as possible in each case. The straight strip electrodes 11 shown in cross-sectional arrangement and extending vertically to the drawing plane have, for example, a width of 4 mm and a vertical centre-centre-clearance of 10 mm.

The electrode connections 14 are connected, for example, at the periphery of the electrode carrier 12 to the individual electrode strips 11. Across the electrode strips 11 there is an electrically insulating protective layer 13, e.g. consisting of $SiO_2$ (glass), over which the substrate 40 is located. The substrate 40 can lie immediately on the protective layer 13 or (as shown) can be arranged with spacers having a clearance spacing from the electrode carrier 12.

The collection area 20 comprises a hollow cathode 21 extending parallel to the periphery of the substrate 40, which cathode is also connected to the control apparatus 50. The hollow cathode 21 has, for example, the design type as described in WO 01/01467.

The travelling wave electrode 10 in the embodiment according to FIG. 1 simultaneously serves as a power electrode which acts together with the counter electrode 30 for the purpose of formation of the plasma in the plasma device 100. The counter electrode 30 can be arranged in the plasma chamber 101 as a ring-shaped, disk-shaped or rod-shaped electrode, or alternatively formed by the wall of the plasma chamber 101. The substrate 40 is selected in dependence on the application of the plasma device 100 and consists of, for example, a semiconductor wafer or glass.

In the control apparatus 50 a voltage source is provided for the establishment of the collection alternating voltage with a pre-determined voltage characteristic which is loaded on the strip electrodes 11 with defined phase shifts. The voltage source also serves to provide the operating voltage for generating the plasma in the plasma chamber 101. For example, all strip electrodes are impacted together with a high-frequent operating voltage with the use of suitable frequency filters.

In FIG. 1, a ramp-shaped voltage characteristic 1 at two different times is shown schematically as an example. As the collection alternating voltage at the strip electrodes 11 is provided in successive order with an increasing delay or phase shift, there is the resulting image of a ramp-shaped field distribution that moves in the time sequence in waveform towards the collection area 20 (see upper arrow). There results a field gradient extending parallel to the surface of the electrode carrier. Particles which, for example, are formed and grown above the substrate 40 as a result of nucleus formation in the plasma undergo a force action by the travelling wave towards the periphery of the substrate 40 where they are taken up or "suctioned up" with the hollow cathode 21.

Figure 2:
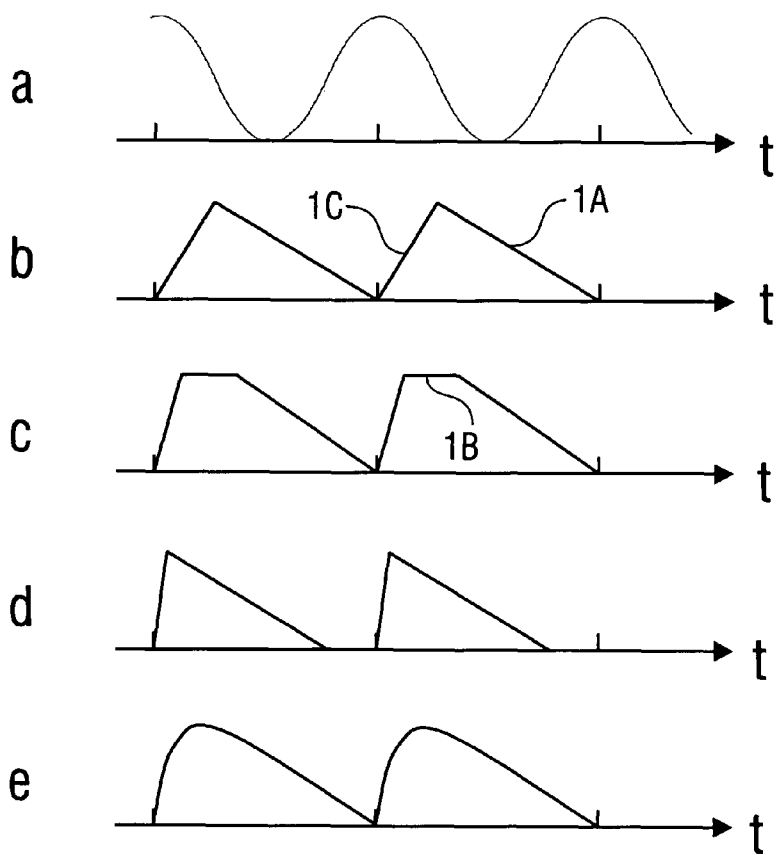
FIG. 2: curve illustrations with examples of collection alternating voltages used according to the invention.

FIG. 2 illustrates different variants of symmetrical or asymmetrical voltage characteristics of the collection alternating voltage. In each case the amplitudes of the alternating voltage portions are shown, with which the strip electrodes 11 are charged. FIG. 2a shows a sinus-shaped sequence of the collection alternating voltage which results in a travelling wave with even rising and falling edges. The other sequences in the FIGS. 2b-2e show asymmetrical shapes with a slowly rising front edge 1A, if required with a direct voltage zone 1B and a rapidly falling rear edge 1C. The edges 1A, 1C in FIG. 2b have, for example, a time ratio of 10:1. This can be varied by the insertion of the direct voltage zones 1B at constant period of the collection alternating voltage (FIGS. 2c, d). FIG. 2e illustrates that the voltage characteristic 1 does not have to be compellingly composed from linear curved pieces, but rather can have also any other time dependency factor.

The amplitude, frequency, curve form (particularly the steepness of the edges) and phase of the collection alternating voltage and, with this, particularly the propagation velocity of the travelling wave are pre-determined with the voltage source in the control apparatus 50. At least one of these variables is selectable with the voltage source. For example, by the selection of the steepness of the falling edge 1C, the particle size can be defined above which there is essentially no particle transport. The concrete quantitative variables are selected by those skilled in the art, particularly in dependence on the particle material, the particle sizes and the field strengths.

Figure 3:
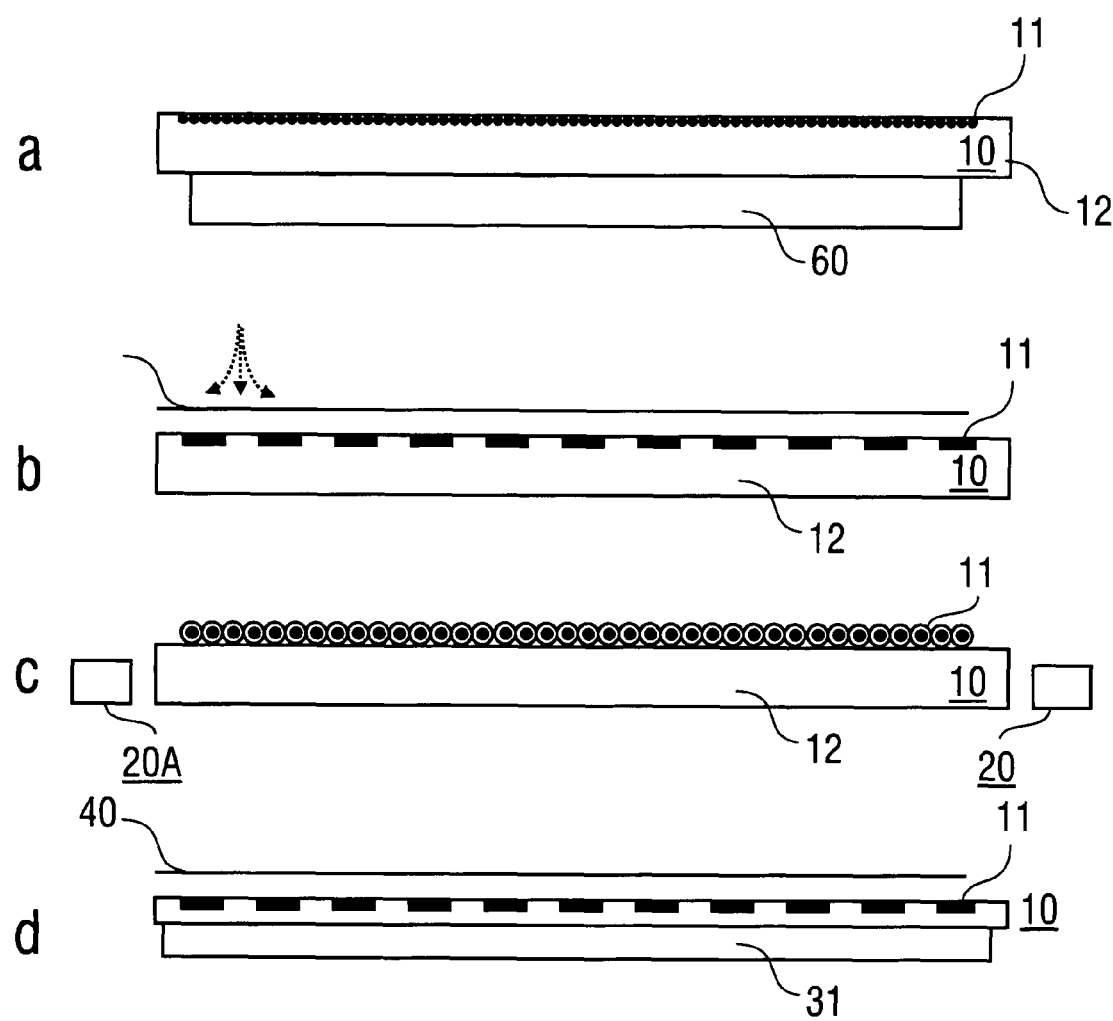
FIG. 3: embodiments of strip electrodes used according to the invention.

FIG. 3 illustrates different variants of a travelling wave electrode 10 with the strip electrodes 11 in or on the electrode carrier 12, in each case as an example with further features of the invention. According to FIG. 3a, wire electrodes are embedded in the surface of the electrode carrier 12. FIG. 3a also illustrates the combination of the travelling wave electrode 10, according to the invention, with a heating device 60 which is thermally connected with the electrode carrier 12 and is, for example, arranged on its underneath side. FIG. 3b shows a variant with strip electrodes 11 in the form of straight electrode bands (cross-sectional illustration). In the left part of FIG. 3b the effect of a high-frequent modulation voltage is shown which is superimposed on the collection alternating voltage. During the course of the travelling wave and subject to the effect of the modulation voltage, ions in the plasma are distributed over an area which extends over two adjacent strip electrodes. The coating of a substrate 40 is homogenised in this way. According to FIG. 3c the strip electrodes 11 are formed in each case by insulated wires or wires embedded in a non-conductive material such as a resin, for example, where said wires are arranged on the surface of the electrode carrier 12. The coating of the strip electrodes 11, shown as an example in FIG. 3c, can also be advantageous for the protection of the strip electrodes against undesirable deposition. Furthermore, FIG. 3c illustrates as an example the arrangement of two collection areas 20, 20A on different sides of the electrode carrier.

FIG. 3d shows a structural arrangement with a substrate 40 to be coated, similar to FIG. 3b, where in this case, however, a separate power electrode 31 is provided in addition to the travelling wave electrode 10, which power electrode is loaded with the operating voltage for the formation of the plasma condition in the plasma device. For this purpose, the strip electrodes 11 and the power electrode 31 have separate connecting lines (not shown) for connection to the control apparatus 50.

Figure 4:
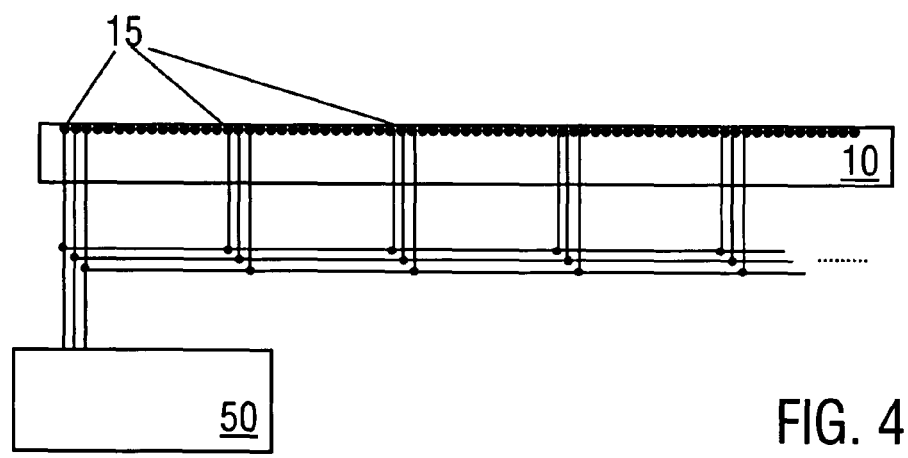
FIG. 4: an illustration of the formation of strip electrode groups.

FIG. 4 illustrates schematically the formation of electrode strip groups 15 where successively arranged electrode strips 11 are periodically connected with one another. In the illustrated example, the 1st, 16th, 32nd etc. electrode strips 11 are electrically connected with one another and are loaded with the same phase position of the collection alternating voltage, while the following 2nd, 17th and 33rd strip electrode, in each case, are loaded with a common phase which is, however, delayed relative to the first phase position. Accordingly, and with the control apparatus 50, the voltage characteristic of the desired collection alternating voltage must only be established with 15 different phase positions in order to generate the travelling wave moving over the entire substrate.

FIGS. 5a and 5b show the application of the invention with the plasma-based material deposition on the substrate 40. According to FIG. 5a the travelling wave electrode 10 is located on the side of the vertically aligned substrate 40 facing away from the plasma 2. The travelling waves are generated parallel to the substrate surface, running vertically downwards, to the lower periphery of the substrate. FIG. 5 shows the two-sided usage of the travelling wave electrode 10 which is arranged here between two substrates 41, 42 and which is significant for practical applications.

FIG. 6 illustrates the combination, according to the invention, of the travelling wave electrode 10 and the collection area 20 in a schematic perspective view with further details. The strip electrodes 11 are embedded in the electrode carrier 12. The electric connection is effected by way of the electrode connections 14 at the periphery of the electrode carrier 12. The hollow cathode 21 of the collection area 20 extends over the entire length of the strip electrodes 11 at the periphery of the electrode carrier 12.

Figure 7:
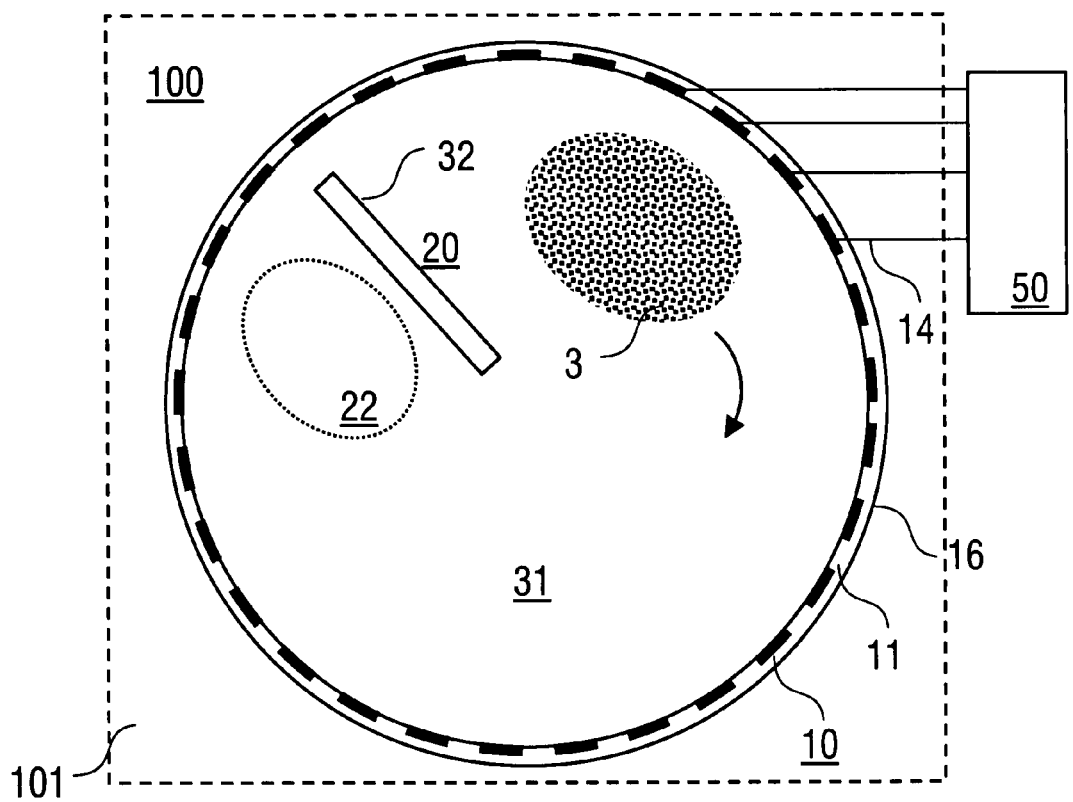
FIG. 7: a schematic top view of a further embodiment of a plasma device, according to the invention, with strip electrodes in ring-shaped arrangement.
Figure 8:
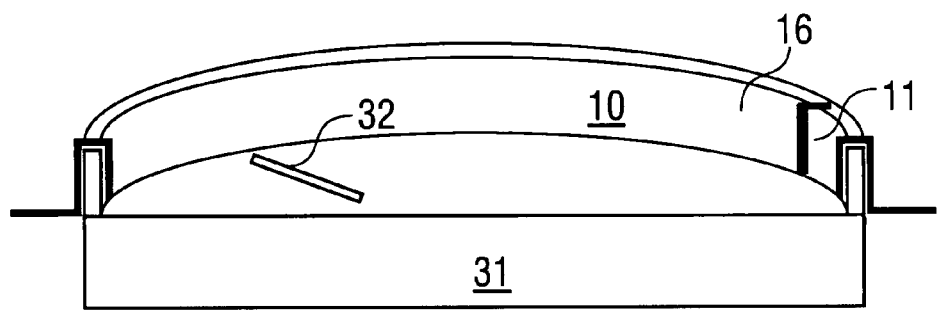
FIG. 8: a perspective cross-sectional illustration of the arrangement of strip electrodes with the embodiment according to FIG. 7.

A further modified embodiment of the invention, in which circular shaped particle movements are generated, is schematically illustrated in the FIGS. 7 and 8. According to FIG. 7, in the plasma device 100 with the plasma chamber 101 which can be evacuated, a power electrode 31 is provided and shown schematically in top view, on whose peripheral rim the travelling wave electrode 10 extends with a plurality of electrode strips 11 on a ring-shaped electrode carrier 16. The power electrode 31 contains a cut-out 32, at which the collection area 20 is formed. FIG. 8 shows a corresponding structural configuration in cross-sectioned perspective view. Each of the strip electrodes 11 is connected to the control apparatus 50 which contains the voltage source for generating the collection alternating voltage and the modulation voltage. For reasons of clarity, not all electrode connections 14 of the individual strip electrodes 11 are shown in FIG. 7 and not all strip electrodes in FIG. 8.

With the embodiment shown in FIGS. 7 and 8, circularly running travelling waves are generated with which the particles 3 in the plasma are moved over the power electrode 31 on circular paths. The movement is effected up to section 32 where, for example, the particles are suctioned out of the plasma chamber with a hollow cathode (not shown).

FIG. 7 also schematically shows an accumulation zone 22 which comprises a zone area in the plasma chamber, in which and by means of a corresponding activation of the adjacent electrodes or as a result of the non-existence of electrodes, conditions are present in such a way that the particles 3 accumulate in this zone area.

The particle transport takes place with a higher degree of effectiveness at the radial outer rim of the power electrode 31. For this reason, the circular movement of the particles is superimposed with a radial and outwardly directed diffusion movement of particles.

A significant advantage of the embodiment of the invention as shown in FIGS. 7 and 8 lies in the fact that, with the ring-shaped electrode carrier 16, existing plasma reactors can be backfitted in an uncomplicated manner. In order to protect the strip electrodes 11 against deposition during the operation of the plasma device, a heating device can be provided for heating the strip electrodes 11 and/or a coating of the strip electrodes 11, e.g. with glass, can be provided.

A further advantage of the illustrated embodiment lies in the option of generating a continual particle flow with a constant or with a variable speed in the plasma device in order to examine the interactions between the particles which form the so-called fluid or crystalline conditions.

The features of the invention as disclosed in this description, in the claims and in the drawings can be of significance both individually as well as in combination for the realisation of the invention in its various embodiments.

The invention claimed is:

1. A method for the operation of a plasma device in which particles are arranged in a plasma, comprising the step of:
   generation of electric travelling waves under whose effective action the particles in the plasma device perform a directed movement to at least one pre-determined collection area.

2. The method according to claim 1, wherein, for the generation of the electric travelling waves, a plurality of strip electrodes in the plasma device are loaded with at least one collection alternating voltage.

3. The method according to claim 2, wherein the strip electrodes with the collection alternating voltage are loaded in each case with a pre-determined phase displacement.

4. The method according to claim 2, wherein the collection alternating voltage is provided with a symmetrical voltage characteristic which contains in each case two edges symmetrical to one another within one period.

5. The method according to claim 2, wherein the collection alternating voltage is provided with an asymmetrical voltage characteristic which contains in each case two edges with different steepnesses within one period.

6. The method according to claim 2, wherein the collection alternating voltage contains at least one direct voltage section within a period.

7. The method according to claims 2, wherein the steepness and/or the duration of the edges of the collection alternating voltage are selected in such a way that, exclusively, particles with a size below a pre-determined maximum size perform the directed movement.

8. The method according to claim 2, wherein the collection alternating voltage has a frequency that is less than the frequency of an operating alternating voltage of a plasma discharging for the formation of the plasma.

9. The method according to claim 8, wherein the collection alternating voltage has a frequency that is selected in the range from 0.01 Hz to 10 Hz.

10. The method according to claim 2, wherein the collection alternating voltage is superimposed with a higher frequent modulation voltage.

11. The method according to claims 2, wherein the strip electrodes are loaded with the collection alternating voltage and an operating voltage of the plasma device.

12. The method according to claim 10, wherein the higher frequent modulation voltage has a frequency in the range from 0.1 kHz to 100 kHz.

13. The method according to claim 2, wherein the strip electrodes are loaded with the collection alternating voltage and a separate power electrode is loaded with an operating voltage of the plasma device.

14. The method according to claim 10, wherein the higher frequent modulation voltage has a frequency in the range from 10 kHz to 1 MHz.

15. The method according to claim 1, wherein a generation of the electric travelling waves is provided with directions opposing one another in such a way that the particles perform directed movements to two pre-determined collection areas.

16. The method according to claim 1, wherein the particles in the collection area are taken up by a hollow cathode.

17. The method according to claim 1, wherein the collection area comprises an enrichment zone in which the particles in the plasma are accumulated.

18. The method according to claim 1, wherein the particles perform an aligned linear movement or an aligned circular movement.

19. Method of using a method according to claim 1, comprising the step of:
   withdrawal of particles from a plasma device,
   generation of a particle cloud with a pre-determined particle size distribution, or
   deposition of particles on substrates during the manufacture of polymorphic solar cells.

20. Method of using a plasma device according to claim 1, comprising the step of:
   withdrawal of particles from the plasma device,
   generation of a particle cloud with a pre-determined particle size distribution, or
   deposition of particles on substrates during the manufacture of polymorphic solar cells.

21. A plasma device for the formation of a plasma, comprising:
   a travelling wave electrode for the generation of electric travelling waves under whose effective action particles in the plasma device perform a directed movement, and
   at least one pre-determined collection area, to which the directed movement of the particles leads.

22. The plasma device according to claim 21, wherein the travelling wave electrode has a plurality of strip electrodes which are connected to a voltage source for the generation of at least one collection alternating voltage, with which the strip electrodes can be loaded.

23. The plasma device according to claim 22, wherein the voltage source contains a phase shift device which is configured for loading the strip electrodes with the collection alternating voltage, in each case with a pre-determined phase position.

24. The plasma device according to claim 22, wherein the voltage source for generating the collection alternating voltage is configured with at least one of the following voltage characteristics:
   symmetrical voltage characteristic which contains two edges symmetrical to one another within one period,
   asymmetrical voltage characteristic which contains two edges with different steepnesses within one period, and
   voltage characteristic which contains one direct voltage area within one period.

25. The plasma device according to claim 24, wherein the voltage source is controllable for the selection of the steepness and/or the duration of the edges.

26. The plasma device according to claim 22, wherein the voltage source is configured for the generation of the collection alternating voltage with a frequency that is less than the frequency of a high-frequent alternating voltage for the generation of the plasma.

27. The plasma device according to claim 22, wherein the voltage source is configured for generating a higher frequent modulation voltage for superimposition with the collection alternating voltage.

28. The plasma device according to claim 22, wherein the voltage source is configured for generating an operating alternating voltage of the plasma device for plasma generation and the travelling wave electrode is loaded with the operating alternating voltage.

29. The plasma device according to claim 21, containing a separate power electrode that is loaded with a operating alternating voltage of the plasma device for the plasma generation.

30. The plasma device according to claim 21, wherein the collection area has a hollow cathode.

31. The plasma device according to claim 21, wherein the collection area has an enrichment zone in which the particles in the plasma are accumulated.

32. The plasma device according to claim 21, wherein the travelling wave electrode has a plate-shaped electrode carrier, the strip electrodes being arranged on at least one surface of the plate-shaped electrode carrier.

33. The plasma device according to claim 32, wherein the strip electrodes are arranged on both surfaces of the plate-shaped electrode carrier.

34. The plasma device according to claim 32, wherein the strip electrodes comprise wire electrodes or electrode bands.

35. The plasma device according to claim 21, wherein the travelling wave electrode has a ring-shaped electrode carrier, the strip electrodes being arranged on at least one surface of the ring-shaped electrode carrier.

36. The plasma device according to claim 22 having a plurality of strip electrode groups, wherein the strip electrodes belonging to one strip electrode group are electrically connected with one another so that they can be loaded with the collection alternating voltage with the same phase position.

37. The plasma device according to claims 21, wherein a heating device is provided, with which the travelling wave electrode can be tempered.

* * * * *